United States Patent
Smith et al.

(10) Patent No.: US 6,481,447 B1
(45) Date of Patent: Nov. 19, 2002

(54) FLUID DELIVERY RING AND METHODS FOR MAKING AND IMPLEMENTING THE SAME

(75) Inventors: Stephen M. Smith, Morgan Hill; Randolph E. Treur, Pleasanton, both of CA (US)

(73) Assignee: Lam Research Corporation, Fremont, CA (US)

( * ) Notice: Subject to any disclaimer, the term of this patent is extended or adjusted under 35 U.S.C. 154(b) by 40 days.

(21) Appl. No.: 09/672,173

(22) Filed: Sep. 27, 2000

(51) Int. Cl.[7] ................................. B08B 3/02
(52) U.S. Cl. ................ 134/103.2; 134/148; 134/153; 134/157; 134/198; 134/902
(58) Field of Search .................. 134/94.1, 95.3, 134/99.1, 103.2, 148, 153, 157, 198, 902; 239/557, 558, 559

(56) References Cited

U.S. PATENT DOCUMENTS

| | | | |
|---|---|---|---|
| 4,313,266 A | | 2/1982 | Tam ................. 34/8 |
| 4,529,474 A | * | 7/1985 | Fujiyama et al. |
| 4,651,440 A | | 3/1987 | Karl ................ 34/58 |
| 4,855,775 A | * | 8/1989 | Matsuoka |
| 4,902,609 A | * | 2/1990 | Lamb et al. |
| 4,950,156 A | | 8/1990 | Philipossian ........ 432/253 |
| 5,312,487 A | * | 5/1994 | Akimoto et al. |
| 5,522,936 A | * | 6/1996 | Tamura |
| 5,683,537 A | * | 11/1997 | Ishii |
| 5,744,049 A | * | 4/1998 | Hills et al. |
| 5,851,041 A | | 12/1998 | Anderson et al. ...... 294/106 |
| 5,950,327 A | | 9/1999 | Peterson et al. ...... 34/328 |
| 5,976,308 A | * | 11/1999 | Fairbairn et al. |
| 5,989,652 A | * | 11/1999 | Ameen et al. |
| 6,013,155 A | * | 1/2000 | McMillin et al. |
| 6,020,570 A | * | 2/2000 | Taki et al. |
| 6,024,827 A | * | 2/2000 | Ishii |
| 6,027,574 A | * | 2/2000 | Fishkin et al. |
| 6,027,662 A | | 2/2000 | Kaveh .............. 216/59 |
| 6,043,167 A | * | 3/2000 | Lee et al. |
| 6,143,078 A | * | 11/2000 | Ishikawa et al. |
| 6,202,318 B1 | * | 3/2001 | Guldi et al. |
| 6,215,087 B1 | * | 4/2001 | Akahori et al. |
| 6,221,740 B1 | * | 4/2001 | Bryan et al. |
| 6,248,168 B1 | * | 6/2001 | Takeshita |
| 6,270,862 B1 | * | 9/2001 | McMillin et al. |
| 6,323,119 B1 | * | 11/2001 | Xi et al. |
| 6,355,902 B2 | * | 3/2002 | Akahori et al. |
| 6,364,995 B1 | * | 4/2002 | Fairbarin et al. |
| 6,394,109 B1 | * | 5/2002 | Somekh |

FOREIGN PATENT DOCUMENTS

| | | | |
|---|---|---|---|
| EP | 0 967 632 A1 | 12/1999 | ........... H01L/21/00 |
| JP | 61-296724 | * 12/1986 | |
| JP | 1-260823 | * 10/1989 | |
| JP | 1-286424 | * 11/1989 | |
| JP | 2-138737 | 5/1990 | ......... H01L/21/304 |
| JP | 3-131026 | * 6/1991 | |
| JP | 3-178121 | * 8/1991 | |
| WO | WO99/45585 | 10/1999 | ........... H01L/21/31 |
| WO | WO 00/30158 | 5/2000 | ........... H01L/21/00 |

OTHER PUBLICATIONS

A. Higginson and K. Stokes, "Disk Support for Spin Drying", Nov. 1975, vol. 18, No. 6, IBM Technical Disclosure Bulletin.

* cited by examiner

*Primary Examiner*—Frankie L. Stinson
(74) *Attorney, Agent, or Firm*—Martine & Penilla, LLP

(57) ABSTRACT

A fluid delivery module for use in preparing a substrate is provided. The fluid delivery module includes a process bowl designed to contain a substrate to be prepared. The process bowl has a bottom wall and a sidewall. The fluid delivery module further includes a fluid delivery ring configured to be attached to the sidewall of the process bowl. The fluid delivery ring includes a plurality of inlet and outlet pairs. Each of the plurality of inlet and outlet pairs is defined in the fluid ring and is designed to receive a respective supply tube. Each respective supply tube has an end that terminates at each of the outlets of the fluid delivery ring and is configured to direct fluid onto a surface of the substrate.

21 Claims, 8 Drawing Sheets

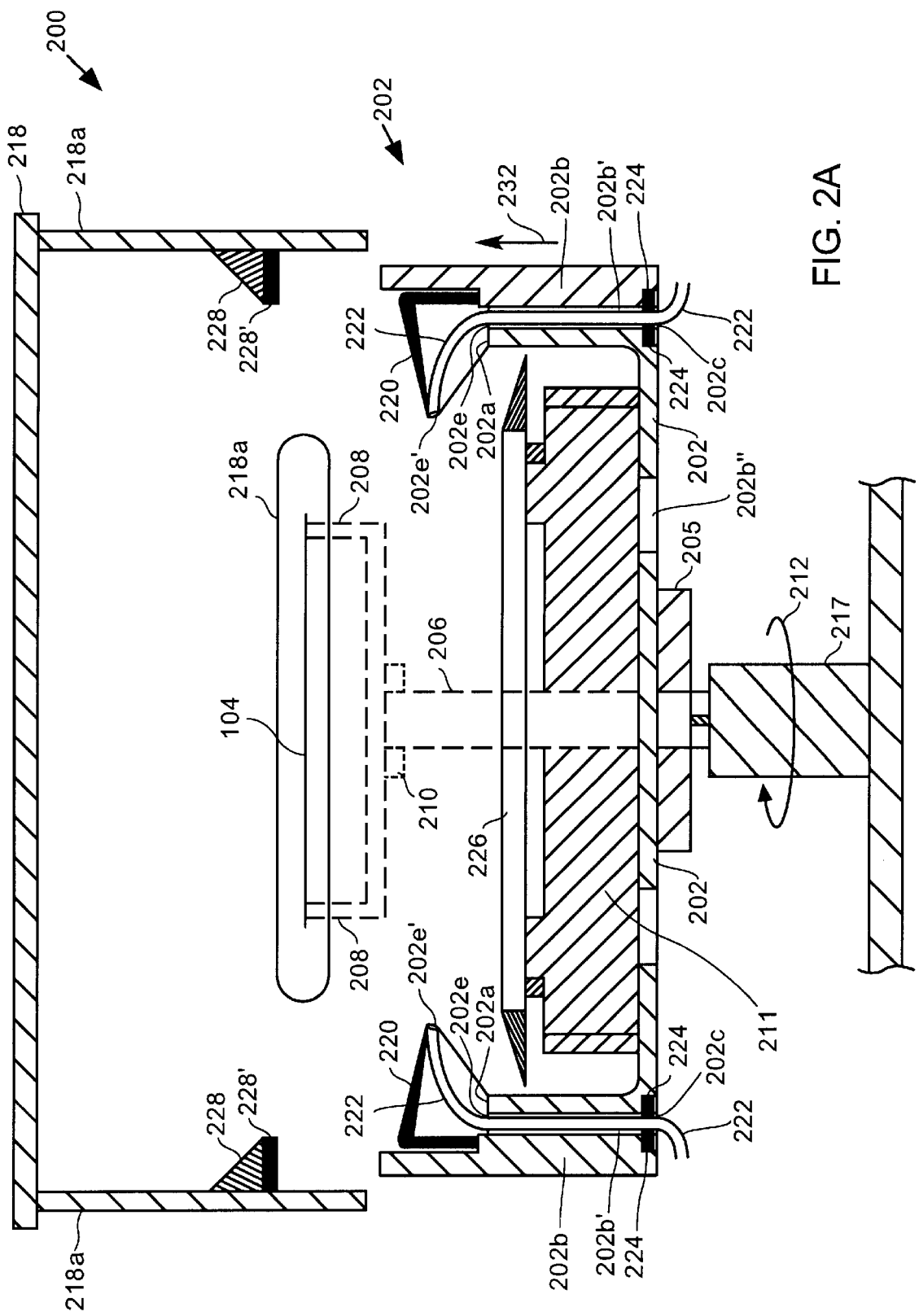

FLUID DELIVERY RING AND METHODS FOR MAKING AND IMPLEMENTING THE SAME

BACKGROUND OF THE INVENTION

1. Field of the Invention

The present invention relates generally to semiconductor wafer cleaning and, more particularly, a fluid delivery ring to be utilized in semiconductor wafer spin, rinse, and dry (SRD) modules.

2. Description of the Related Art

Wafer preparation and cleaning operations are performed in fabrication of semiconductor devices. In one of such wafer preparation operations, a wafer is spin rinsed in a spin, rinse, and dry (SRD) module. A simplified schematic diagram of an exemplary prior art SRD module 100 is provided in FIG. 1. As illustrated, the SRD module 100 includes a bowl 102 rigidly mounted on an SRD housing 118. The SRD housing 118 has a bore to receive a shaft 117, which is coupled to a motor 116. The motor 116 causes the shaft 117 and thus the spindle 106 and a wafer 102 to rotate in a rotation direction 112. A chuck 110 extends through the bowl 102 and is mounted on a spindle 106. A seal 126 is defined between the spindle 106 and the shaft 117 in order to prevent chemicals from exiting the SRD module. Four spindle fingers 108 coupled to the chuck 110, support the wafer 104 along its edges. In the SRD module 100, the chuck 110 moves vertically in the movement direction 114. As such, the chuck 110 moves upwardly in the bowl 102 such that it extends outside the bowl 102 and above bowl lips 102a. Once the wafer 104 is delivered to the spindle fingers 108 at a level above the bowl lips 102a, the chuck 110 moves downward and back into the bowl 102 such that the wafer 104 is disposed below the bowl lips 102a.

A backside rinse nuzzle 124 mounted on the inner surface of bottom wall of the bowl 102 sprays liquid (e.g., DI water) onto the bottom side of the wafer 104. A spigot 120 is disposed above the bowl 102 and above the wafer 104. A fluid (e.g., DI water) supplied to the spigot 120 through a tube 122 is sprayed onto the surface of the wafer 104 as the wafer is spun at high revolutions per minute (RPMs). The spigot is designed to move horizontally, in the spigot movement direction 121. At the conclusion of the rinsing operation, the accumulated fluid is drained through the drain port 128 defined in the bottom wall of the bowl 102 as well as the bottom wall of the SRD housing 118. Once the surface of the wafer 104 and the bottom of the wafer 104 are sprayed with fluid, the supplying of fluid is stopped by turning off the spigot 120. Thereafter, the wafer 104 is dried by being spun at high RPMs. As soon as the wafer is dried, the chuck 110 is once again moved upward from within the bowl 102 and is extended to the outside of the bowl 102 and the bowl lips 102a so as to unload the processed wafer 104.

Several problems can be associated with the conventional SRD module 100. One primary concern associated with the conventional SRD module is the use of a single spigot for fluid delivery onto the surface of the wafer. One problem with the use of the single point fluid delivery spigot is that such system fails to yield an optimum rinsing operation as some portions of the wafer may not be exposed to sufficient amount of rinsing fluid. A second major problem is that the use of spigots may result in the recontamination of a processed wafer. This occurs because even after the fluid delivery has seized, excess liquid still remains in the spigot 120. As such, frequently, the excess fluid (e.g., DI water) remained in the spigot 120 flows out of the spigot 120 and drips on an otherwise clean surface of the wafer 104 recontaminating the surface of the processed wafer (e.g., causing stains or particulate spots). When such dripping occurs, the SRD operation must be repeated again (if detected), thereby reducing throughput as a result of increasing the overall time expended in the SRD module. If the problem is undetected, the quality of the cleaning goes down.

Another problem associated with the typical SRD module is having chemically incompatible components. In a typical SRD module, the chuck 110 is usually made out of Aluminum, the bowl 102 is made out of polyurethane, and the spigot is made out of stainless steal. These components may enter into chemical reactions with the fluids introduced into the SRD module. As a consequence, further contaminants may be introduced into the SRD module. For instance, as the chuck 110 moves up and down within the bowl 102, some of its coating flakes off of the chuck thus generating particulates and contaminants inside the bowl 102 and the SRD module 100. These contaminants may react with the residual chemicals (e.g., HF, $NH_3OH$, etc.) present in the SRD module from the previous operation of brush scrubbing of the wafer surfaces. As a result of such chemical reactions between the generated particulates and contaminants of the chuck 110 with the residual chemicals, the wafer 104 as well as the SRD module is recontaminated.

In addition to introducing contaminants, the typical SRD module utilizes a chuck having an extremely complex design. In the conventional SRD module, the chuck 110 moves up and down through the bowl 102 to receive and deliver the wafer 104. As such, it is imperative that the chuck remain properly calibrated so that it comes to rest at the exact orientation. In situations where the chuck is not properly aligned, the failure to properly receive and deliver the wafer, mandates the realignment of the chuck. The process of realigning the chuck is very time consuming and labor intensive. Consequently, in order to realign the chuck, the SRD module must be taken off-line for an extended period of time thus reducing the throughput.

In view of the foregoing, a need therefore exists in the art for a chemically compatible SRD module that enables efficient rinsing of a surface of a substrate without recontaminating the substrate surface.

SUMMARY OF THE INVENTION

Broadly speaking, the present invention fills these needs by providing an apparatus and related methods for optimizing the rinsing operation of a spin, rinse, and dry (SRD) module. Preferably, the SRD module is constructed from chemically compatible components and is designed to facilitate uniform delivery of rinsing fluid onto a surface of a substrate to be rinsed. The SRD module is configured to include a delivery ring having a plurality of ring inlets and a plurality of opposing ring outlets wherein the number of ring inlets are equivalent to the number of ring outlets. Also included are a plurality of slots defined between each ring inlet and its respective opposing outlet. In one embodiment, a plurality of supply tubes are configured to deliver rinsing fluid onto the surface of the substrate utilizing the plurality of the ring inlets, the ring outlets, and the slots. It should be appreciated that the present invention can be implemented in numerous ways, including as a process, an apparatus, a system, a device, or a method. Several inventive embodiments of the present invention are described below.

In one embodiment, a fluid delivery module for use in preparing a substrate is disclosed. The fluid delivery module includes a process bowl designed to contain a substrate to be prepared. The process bowl has a bottom wall and a sidewall. Also included in the fluid delivery module is a fluid delivery ring configured to be attached to the sidewall of the process bowl. The fluid delivery ring includes a plurality of inlet and outlet pairs. Each of the plurality of inlet and outlet pairs is defined in the fluid ring and is designed to receive a respective supply tube. Each respective supply tube has an end that terminates at each of the outlets of the fluid delivery ring and is configured to direct fluid onto a surface of the substrate.

In another embodiment, a method for making a fluid delivery ring is disclosed. The method starts by generating a solid ring having a side surface, a top surface, and an under surface. Then, a plurality of slots are formed into the under surface of the solid ring. Each of the plurality of slots extends into the solid ring and defines a sidewall proximate to the side surface and a topwall proximate to the top surface. Thereafter, the method proceeds to generating inlet holes and outlet holes at each of the plurality of slots. The inlet holes are defined into an intersection of the sidewall and the under surface and the outlet holes are defined into an intersection of the topwall and the under surface. The respective inlet holes, outlet holes and slots define paths for receiving tubes. The tubes are configured to deliver the fluid to a region within the fluid delivery ring.

In yet another embodiment, a method for rinsing a semiconductor wafer in a module utilizing a fluid delivery ring is disclosed. The method starts by providing a process bowl having a generally circular shape bottom wall and a sidewall. The sidewall extends upwardly from the bottom wall to define a cylindrical chamber. The sidewall further includes a plurality of channels extending from the bottom wall to an upper edge of the sidewall. Next, the method proceeds by attaching a fluid delivery ring onto the sidewall of the process bowl. Then, a plurality of supply tubes are inserted into the fluid delivery ring, utilizing the process bowl. The fluid delivery ring includes a plurality of ring inlet and outlet pairs and a plurality of respective slots. Subsequently, fluid is delivered to the supply tubes and is directed onto a surface of a semiconductor wafer defined within the process bowl.

In still a further embodiment, a fluid delivery ring attached to a sidewall of a process bowl for use in a substrate spin module is disclosed. The fluid delivery ring includes a plurality of inlet and outlet pairs defined in the fluid delivery ring. Each of the plurality of inlet and outlet pairs is designed to receive a respective supply tube. Each respective supply tube has an end that terminates at each of the outlets of the fluid delivery ring and is configured to direct fluid onto a surface of the substrate.

In still a further embodiment, a fluid delivery ring for use in a substrate rinsing module is disclosed. The fluid delivery ring includes a triangular structure having a sidewall, an underside, and a generally circular shape topwall. The fluid delivery ring also includes a plurality of inlet and outlet pairs. The inlets are defined between the sidewall and the underside and the outlets are defined between the underside and the topwall. Each inlet and outlet pair is configured to receive and secure a plurality of respective supply tubes. Each of the respective supply tubes is configured to terminate at each of the respective outlets and to deliver fluid on to a surface of a substrate to be prepared.

The advantages of the present invention are numerous. Most notably, instead of using a single fluid delivery spigot, a fluid delivery ring having multiple fluid delivery points for uniformly delivering fluid onto the substrate surface is utilized. The fluid delivery ring of the present invention supplies fluid through a plurality of supply tubes, which are fed through a plurality of inlets and outlets. In the present invention, the outlets are configured to be distanced from the edge of the substrate surfaced. Thus, the embodiments of the present invention eliminate the post process contamination of an otherwise clean surface of a substrate with potential droplets of fluid remained in the spigot. Another advantage of the SRD module of the present invention is that the SRD module utilizes all chemically compatible components so as to prevent introduction of additional contaminants into the spin rinsing operation. Still another advantage of the fluid delivery ring of the present invention is that it is retrofittable, thereby allowing the SRD module to spin rinse various sized wafers. Ultimately, the fluid delivery ring is capable of delivering fluid to multiple critical contact points on the surface of the wafer thus optimizing the overall performance of the SRD module.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIG. 2A is a simplified cross-sectional view of an SRD module, wherein the SRD process bowl is defined in a lower position, in accordance with one embodiment of the present invention.

FIG. 4D-1 is a partial three-dimensional view of a fluid delivery ring, illustrating one of several hollow cavities, slots of the fluid delivery ring, in accordance with yet another embodiment of the present invention.

FIG. 4D-2 is a three-dimensional view of the slot of FIG. 4D-1, depicting a removed volume of the fluid delivery ring, in accordance with yet another aspect of the present invention.

DETAILED DESCRIPTION OF EXEMPLARY EMBODIMENTS

Figure 1:
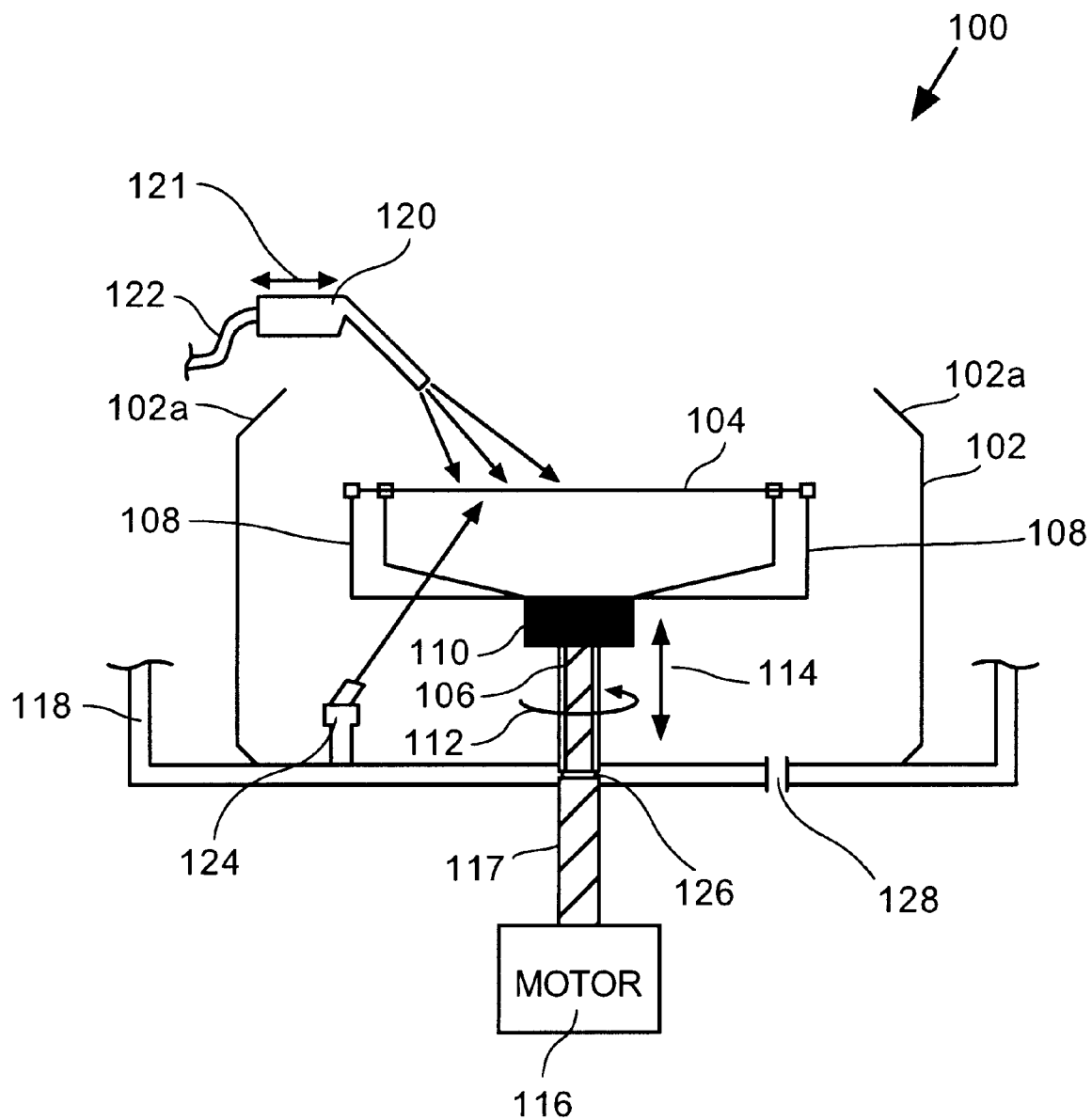
FIG. 1 illustrates an exemplary prior art spin, rinse, and dry (SRD) module.

Embodiments of a spin, rinse, and dry (SRD) module and a fluid delivery ring for use in an SRD module for optimizing the rinsing operation of a substrate surface while minimizing the possibility of surface recontamination are described. Preferably, the SRD module is configured to include all chemically compatible components. In a preferred implementation, the SRD module is configured to facilitate uniform delivery of rinsing fluid onto the surface of the substrate being rinsed. Preferably, the SRD module includes a fluid delivery ring having a plurality of ring inlets and a plurality of opposing ring outlets, wherein the number of ring inlets are equivalent to the number of opposing ring outlets. Rinsing fluid is configured to be uniformly supplied to the fluid delivery ring through a plurality of supply tubes utilizing the plurality of the ring inlets and the ring outlets. In one preferred embodiment, each of the supply tubes is configured to be a contiguous tube.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

FIG. 2A is a simplified cross-sectional view of a spin, rinse, and dry (SRD) module 200, in accordance with one embodiment of the present invention. As shown, the SRD unit 200 includes an SRD process bowl 202, which in this embodiment, is defined in a lower position. The SRD process bowl 202 has a generally cylindrical shape and is defined within an SRD process chamber 218 also having a cylindrical shape. The SRD process bowl 202 is defined on a shaft 217, and the shaft is configured to rotate in a rotation direction 212. The SRD process bowl 202 is further configured to move upwardly from the lower position so as to assume an upper position. A spindle 206 is positioned within the SRD process bowl 202 and is configured to extend through the bowl 202 with one of its ends being rigidly mounted and the other end being coupled to a chuck 210. A plurality of spindle fingers 208 are mounted on the chuck 210 and are configured to support wafer 104 during the SRD operation.

A sidewall 202b of the SRD process bowl 202 has a lip 202a defined substantially in a same horizontal plane as a ring 226, which is mounted on a ring support 211. The lip 202a of the SRD bowl is configured to be a continuous ring that extends around the inner surface of the SRD process chamber 218. In one embodiment, defined along the circumference of the bowl bottom wall 202b " of the SRD process bowl 202 and inside the bowl sidewall 202b of the SRD process bowl 202 are a plurality of channels 202b'. Each of the channels 202b' is defined to extend upwardly from each of the plurality of the bottom wall holes 202c formed in the bowl bottom wall 202b" of the SRD process bowl 202 substantially up to the lip 202a of the SRD process bowl 202. It must be appreciated by one of ordinary skill in the art that the number of channels 202b' may vary depending upon a particular application. In one exemplary embodiment, the number of the channels 202b' is configured to range from about 1 channels to about 12 channels. In a preferred embodiment, the number of channels 202b' is approximately about 8 channels.

A fluid delivery ring 220 is configured to engage the lip 202a of the SRD process bowl 202. The fluid delivery ring 220 is configured to deliver fluid onto the surface of the wafer 104 during the spin rinsing operation. The fluid can be either a liquid (e.g., DI water, chemicals, etc.) or a gas. Fluid is configured to be supplied to the fluid delivery ring through a plurality of continuous supply tubes 222. The supply tubes 222 are first fed through the plurality of bottom wall holes 202c. Thereafter, the supply tubes 222 are fed to the channels 202b' and the lips 202a of the SRD process bowl to a plurality of ring inlets 220e and ring outlets 220e' of the fluid delivery ring 220.

Each of the supply tubes 222 is configured to be fitted with a plurality of seals 224. The seals 224 are disposed in close proximity to the bottom wall holes 202c. As such, a seal is defined substantially close to an opening of each of the channels 202b'. The use of the plurality of seals 224 are advantages as they hold each of the supply tubes 222 secure in its defined position in the bottom wall of the SRD process bowl 202. The seals 224 are further configured to prevent the introduction of contaminants into the SRD process bowl 202 and the fluid delivery ring 220. It should be appreciated by one of ordinary skill in the art that although the embodiment of this Figure implements one supply tube 222, in a different embodiment, the present invention can be implemented such that a plurality of supply tubes 222 can be fed through each of the channels 202b'. In such situations, the size of the supply tubes 222 can vary such that the plurality of supply tubes 222 are fed to each of the channels 202b'. Alternatively, the size of each channel 202b' may be changed such that one or more supply tubes 222 are fed into each channel 202b'. Of course, depending on the application, the module is designed such that some channels 202b' are fed with a single supply tubes 222 while others are fed with multiple smaller supply tubes 222. In addition, in the situations wherein a plurality of supply tubes 222 are fed into each channel 202b", the module is designed such that, if necessary, each supply tube 222 may deliver a different type of fluid onto the surface of the wafer being prepared. Additional details regarding the shape of the fluid delivery ring 220, the ring inlets 220e and the ring outlets 220e", and the supply tubes are set forth below in connection with the descriptions of FIGS. 3A–4D-2.

The SRD process chamber 218 is defined above the SRD process bowl 202. The SRD process chamber 218 is configured to be slightly larger than the SRD process bowl 202 so that the SRD process chamber 218 can enclose around the SRD process bowl 202 when the SRD process bowl 202 is in the upper position. A stop 228 having a seal 228' is defined on the inner surface of the SRD process chamber 218. In this embodiment, each of the stop 228 and the seal 228' is extending continuous ring. However, it must be appreciated by one of ordinary skill in the art that the stop 228 and the seal 228' may be defined by any number of continuous rings or that the stop 228 and the seal 228' may be of any shape.

As illustrated, once the SRD process bowl 202 is in the lower position, the wafer 104 is passed through a portal 218a of the SRD process chamber 218. In one embodiment, the wafer 104 is passed through a portal 218a with a robotic arm on a wafer transfer path. Once the wafer 104 has gone through the spin rinsing operation, the wafer 104 is then removed from the process chamber 218 with a robotic arm. Although in this embodiment a robotic arm has been utilized to deliver and remove wafer 104 from the process chamber 218, it must be appreciated by one of ordinary skill in the art that other equivalent mechanism may be utilized so long as the function of delivering and removing the wafer from the process chamber is achieved (e.g., such as a wafer transfer path).

Figure 2B:
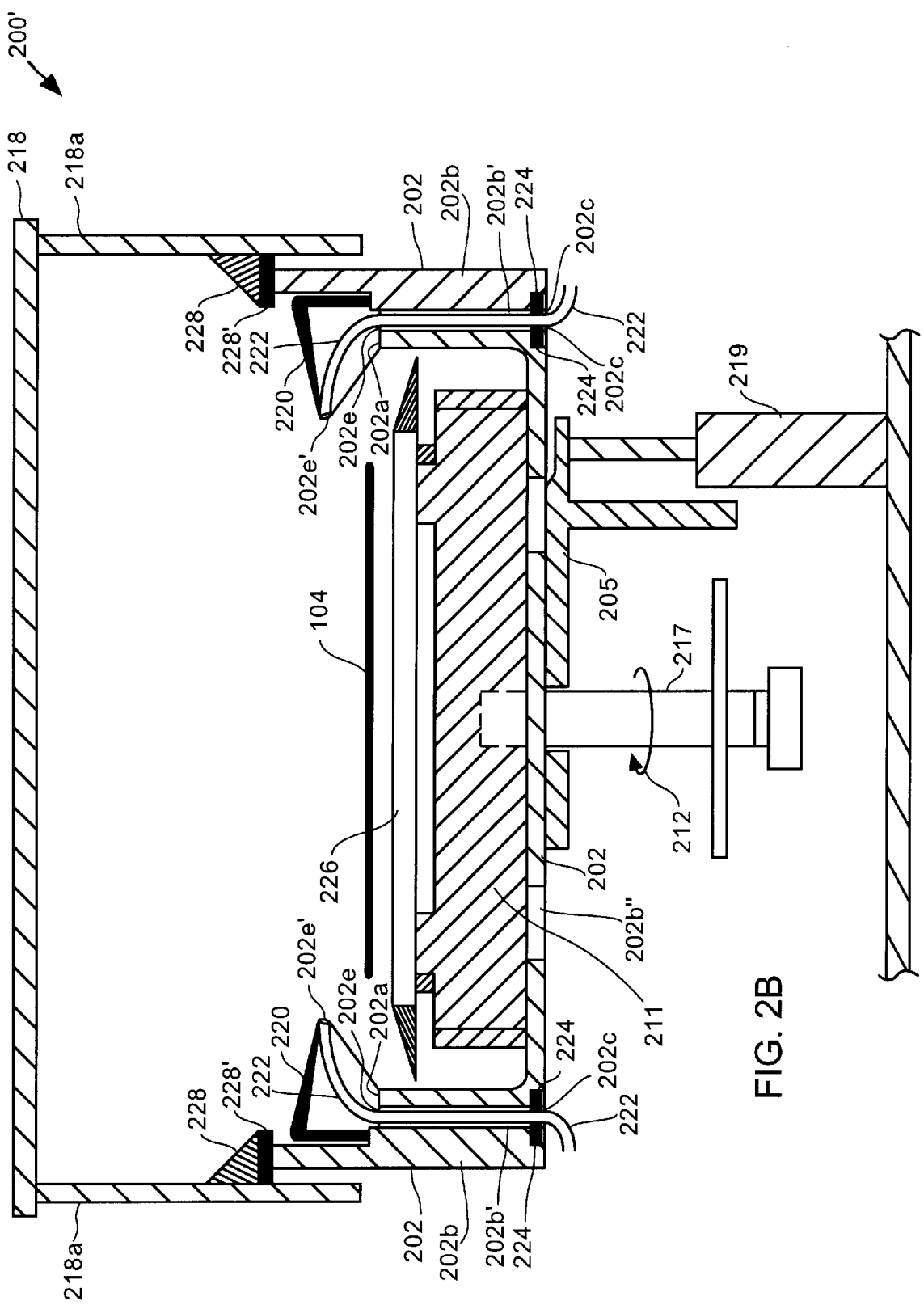
FIG. 2B is a simplified cross-sectional view of the SRD module shown in FIG. 2A, wherein the SRD process bowl is in an upper position, in accordance with another embodiment of the present invention.

FIG. 2B is a simplified partial cross-sectional view of the SRD module of 200 shown in FIG. 2A with the SRD process bowl 202 being in the upper position. In this embodiment, as illustrated, an air cylinder 219 is configured to raise a bracket 205 and consequently the SRD process bowl 202 mounted on a bracket 205 to the upper position. Although the air cylinder 219 has been utilized to raise the bracket 205, it should be apparent to those skilled in the art that other equivalent drive mechanisms may also be used so long as the function of moving the bracket 205 up and down to and from the upper position is achieved (e.g., electric cylinder, servo motor, screw drives, belt drives, etc.).

Furthermore, in this embodiment, the chuck 210 (not shown in this drawing) of the embodiment of FIG. 2B is configured to remain in place. Therefore, unlike the conventional SRD modules that use the movement of the chuck to move the wafer to the upper or lower position, the embodiments of the present invention utilize an air cylinder 219 to move the SRD process bowl 202. Consequently, the present invention has several advantages over the prior art. First, as the chuck 210 remains in place, unlike the prior art SRD module, the present invention eliminates the problems associated with the necessity of designing a complex chuck. Second, since the chuck 210 does not move up or down within the SRD process bowl 202, the chuck 210 would not introduce contaminants and particulates in to the SRD process bowl 202. In one implementation, the chuck 210 of the present invention may be a hollow core chuck having a wafer backing plate as described in U.S. patent application Ser. No. 09/470,690, filed on Dec. 23, 1999, having inventor Roy Winston Pascal, and entitled "Hollow Core Spindle and Spin, Rinse, and Dry Module Including the Same." Furthermore, in a different embodiment, the bowl 202 may be a bowl described in the U.S. patent application Ser. No. 09/470,676, filed on Dec. 23, 1999, having inventors Roy Winston Pascal and Brian M. Bliven, and entitled "Bowl, Spin, Rinse, and Dry Module, and Method for Loading a Semiconductor Wafer into a Spin, Rinse, and Dry Module." These U.S. Patent Applications, which are assigned to Lam Research Corporation, the assignee of the subject application, are incorporated herein by reference.

As illustrated in FIG. 2B, the SRD process bowl 202 is raised until an upper edge of the SRD bowl 202 is engaged by the stop 228 of the SRD process chamber 218. As shown, when the SRD process bowl 202 is in the upper position, the wafer 104 is disposed slightly above the ring 226. This is advantages because as the fluid delivery ring 220 is engaged on the lip 202a of the SRD process bowl 202, the ring outlet 220e' of the fluid delivery ring 220 is configured to be sufficiently distanced from the wafer 104. As such, any fluid droplets coming from supply tubes 222 at ring outlets 220e' do not recontaminate the surface of the SRD processed wafer 104. That is, any droplets would simply fall into the bowl 202 without touching the rinsed surfaces of the wafer 104.

Figure 3A:
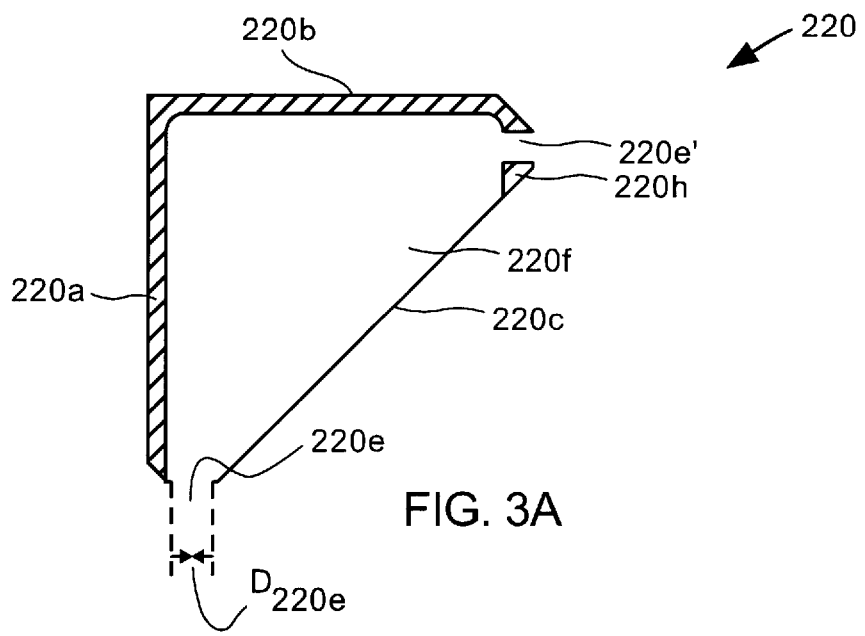
FIG. 3A is an enlarged, simplified, cross-sectional view of a fluid delivery ring having a plurality of slots, in accordance with yet another embodiment of the present invention.

FIG. 3A is an enlarged, simplified, cross-sectional view of a fluid delivery ring 220, in accordance with one aspect of the present invention. As shown, in this embodiment, the cross-section of the fluid delivery ring 220 is configured to be in a shape of a triangle and is defined by a ring sidewall 220a, ring topwall 220b, and a ring hollow portion underside 220c. The ring hollow portion underside 220c is adjacent to an exit surface 220h. In one embodiment, the ring topwall 220b, which defines the top surface of the fluid delivery ring 220 is configured to be a downwardly sloped surface. The ring underside hollow portion 220c represents a partial cavity, defined as a slot 220f, formed within the fluid delivery ring 220. An opening defined as a ring inlet 220e is defined at the intersection of the hollow portion underside 220c and the ring sidewall 220a. In a like manner, a hole defined as a ring outlet 220e' is defined between the exit surface 220h and the ring topwall 220b. A supply tube 222, not shown in this Figure, is to be fed into the fluid delivery ring 220 through the ring inlet 220e.

Figure 3B:
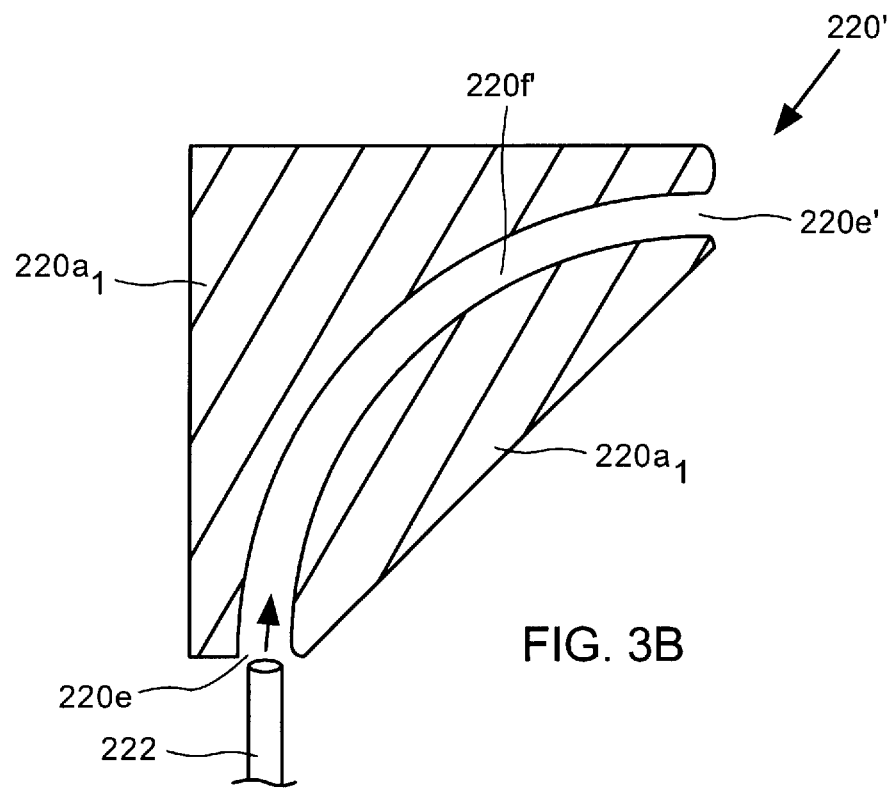
FIG. 3B is an enlarged, simplified, cross-sectional view of a fluid delivery ring having a guiding channel, in accordance with one aspect of the present invention.

As shown, in the configuration of FIG. 3A, the fluid delivery ring 220 is configured to be a solid core structure having a plurality of slots 220f. However, in a different configuration, as shown in the embodiment of FIG. 3B, the fluid delivery ring may be in the form of a solid structure. The fluid delivery ring 220' of FIG. 3B is defined by ring structures $220a_1$. A guiding channel 220f' is configured to be disposed within the ring structures $220a_1$. In this embodiment, a supply tube 222 is to be fed into the guiding channel 220f' of the fluid delivery ring 220 through the ring inlet 220e. Preferably, the inner diameter of each of the ring inlets 220e and ring outlets 220e' approximately ranges from about 1⁄8 inch to about 5⁄32 inch, with a preferable diameter of about 1⁄8 inch.

Although in the implementations of FIGS. 3A and 3B the cross-sections of the fluid delivery ring 220 are in the form of triangles, it must be appreciated by one skilled in the art that the cross-section of the fluid delivery ring 220 may be in any shape. Furthermore, although only one supply tube 222 is shown in FIG. 3B, it must be appreciated by one of ordinary skill in the art that depending on the size of the wafer implemented or the process, any number of supply tubes may be fed through each channel 202b' so as to optimize the operation of the SRD module. As will be shown below, for an exemplary 300 mm wafer, 8 supply tubes 222 are defined equally around the fluid delivery ring 220. Of course, not all supply tubes 222 need to be used at the same time, and different types of fluids can be provided to the various supply tubes 222 depending on the application.

Figure 3C:
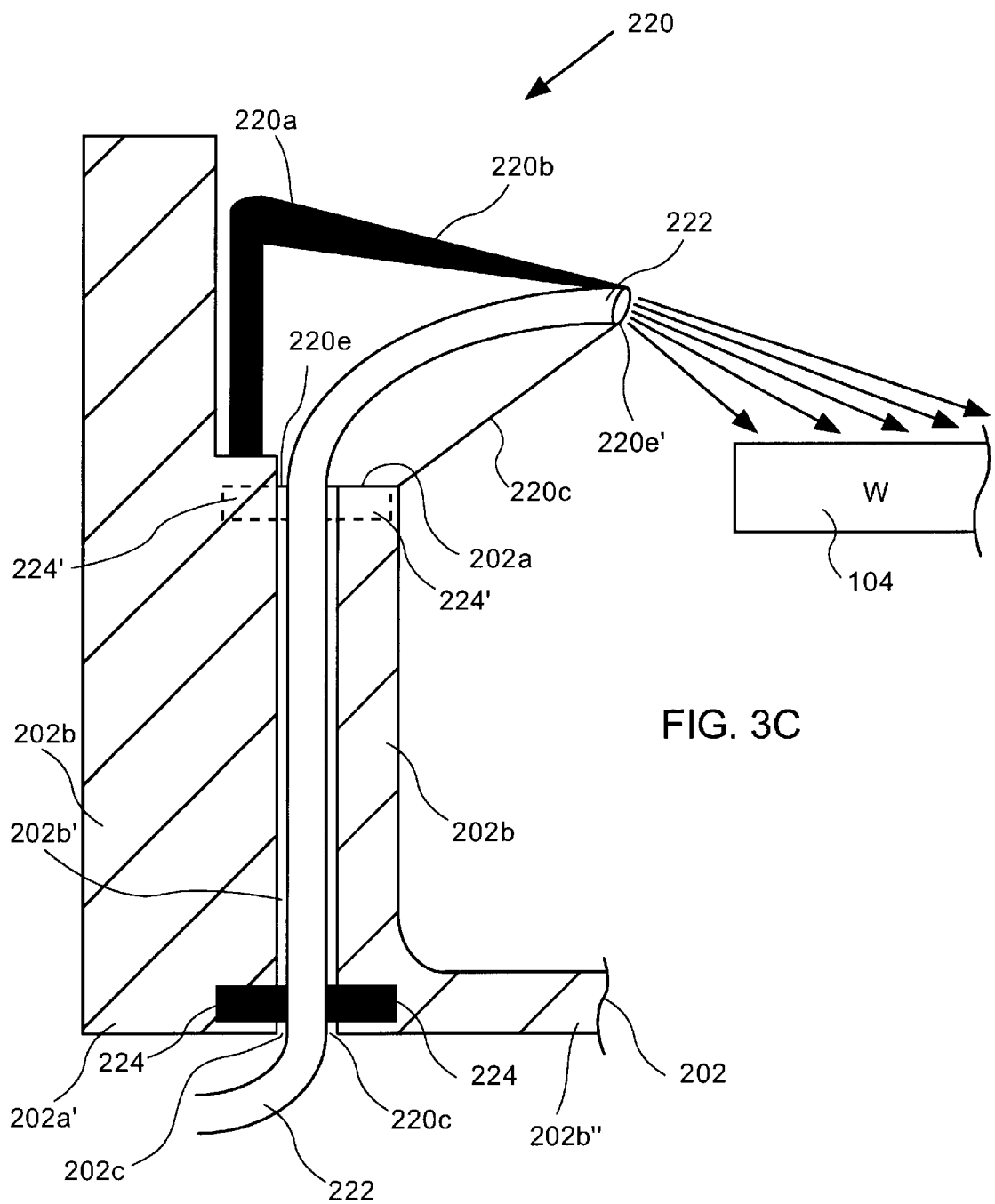
FIG. 3C is an enlarged, partial, cross-sectional view of an SRD module utilizing one contiguous supply tube, in accordance with another aspect of the present invention.

FIG. 3C is an enlarged, partial, cross-sectional view of an SRD module 200 illustrating the use of a continuous supply tube 222, in accordance with one implementation of the present invention. In this embodiment, initially, the supply tube 222 is fed to a channel 202b' of a sidewall 202b of an SRD process bowl 202 through a bottom wall hole 202c of the SRD process bowl 202. Thereafter, the supply tube 222 is delivered through the channel 202b' and a lip 202a of the SRD process bowl 202 to a ring inlet 220e of a fluid delivery ring 220. Subsequently, the supply tube 222 exits the fluid delivery ring 220 through a ring outlet 220e'. As shown, in one embodiment, the supply tube 222 is preferably a single continuous tube so as to improve the integrity of the fluid supply path thus preventing the introduction of contaminants throughout the path. However, in a different embodiment, multiple tube segments may be interconnected so as to define the supply tube 222.

As shown in the embodiment of FIG. 3C, a seal 224 is disposed in the bottom wall 202b" of the SRD process bowl 202 along the channel 202b' so as to secure the supply tube in its place and to prevent fluid leakage. In addition to the seal 224, an optional seal 224' may be defined within the sidewall 202b of the SRD process bowl 202 and substantially close to the lip 202a of the SRD process bowl 202, toward the upper end of the channel 202b'. The optional seal 224' may be utilized to further secure the supply tube within the channel 202b' and to further prevent introduction of contaminants into the spin rinsing operation.

Preferably, in the SRD modules utilizing a single supply tube 222, the inner diameter of the supply tube 222 ranges approximately from about 0.060 inch to about 0.188 inch, and is preferably about 0.060 inch. As such, for an about ⅛ inch supply tube, the flow rate of the fluid can be approximately about 0.7 at about 35 p.s.i.

The SRD module 200 of the FIG. 3C is configured to deliver fluid to the surface of the wafer 104 without recontaminating the surface of the wafer 104. In the conventional SRD modules, the fluid is delivered onto the surface of the wafer 104 via a spigot disposed above the surface of the wafer 104. As such, the droplets of the remaining fluid recontaminate the surface of the processed wafer. In contrast, preferably, in this embodiment of the present invention, the fluid delivery ring 220 is engaged on the lip 202a of the SRD process bowl 202 such that the ring outlet 220c' of the fluid delivery ring 220 is sufficiently distanced from the wafer 104. The distancing of the wafer 104 is achieved as a result of positioning the surface of the wafer 104 on a horizontal plane, which is positioned substantially below the horizontal plain of the ring outlet 220e' of the fluid delivery ring 220. In addition, the vertical plane within which the ring outlet 220e' is positioned, is configured to be substantially closer to the sidewall 202b of the SRD process bowl 202 than that of the edge of the wafer 104. Accordingly, the fluid droplets remained in the supply tube 222 cannot recontaminate the an otherwise clean, rinsed, or prepared surface of the wafer 104.

In addition, preferably, the supply tube 222, the fluid delivery ring 220, and the SRD process bowl 202 are manufactured from a chemically inert material (e.g., Teflon™. This is advantageous as it eliminates the issues associated with the use of chemically incompatible components of the prior art conventional SRD modules. However, it must be appreciated by one of ordinary skill in the art that the supply tube 222, the fluid delivery ring 220, the SRD process bowl 202, and all the other components of the SRD module may be manufactured from different materials so long as the utilized materials are chemically compatible so as to reduce the introduction of contamination into the SRD module (e.g., flouroloy, polypropylene, polyvinylidene fluoride (PVDF), polyethylene, etc.).

Figure 4A:
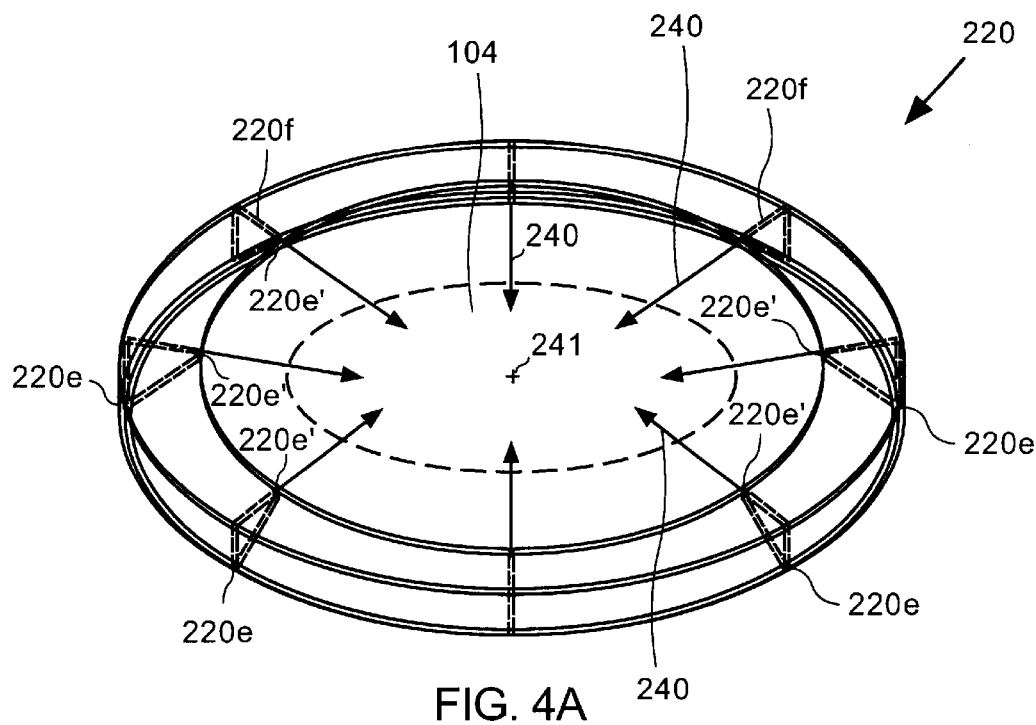
FIG. 4A is a three-dimensional view of a fluid delivery ring having a plurality of ring inlets, a plurality of corresponding ring outlets, and a plurality of corresponding slots, in accordance with another aspect of the present invention.

FIG. 4A is a three-dimensional view of a fluid delivery ring 220 having a plurality of ring inlets 220e and the corresponding ring outlets 220e' and slots 220f. In the embodiment of FIG. 4A, the ring inlets 220e and the corresponding opposing ring outlets 220e' are configured to be defined around the fluid delivery ring 220 such that the ring inlets 220e are substantially symmetrical. In one embodiment, the number of the ring inlets 220e and ring outlets 220e' are about eight. However, the pairs of ring inlets 220e and ring outlets 220e' may vary to any number and be arranged using any relative spacing to achieve the desired fluid application profile over a substrate.

A plurality of hollow cavities defined as slots 220f are defined within the fluid delivery ring 220 substantially between each of the ring inlets 220e and its corresponding ring outlet 220e'. In one preferred embodiment, the number of slots 220f are configured to be equivalent to the pairs of ring inlets 220e and ring outlets 220e'. The slots 220f are designed so that a supply ring 222 can exit from the fluid delivery ring 220 after the supply tube is inserted into the fluid delivery ring 220 through one of the ring inlets 202e. Thus, in one implementation, fluid (e.g., DI water) is to be substantially uniformly distributed over the surface of the wafer 104 through the supply tubes 222. As such, preferably, the supply tubes 222 are fed through the ring inlets 220e and out of the opposing ring outlets 220e' to deliver the fluid onto the surface of the wafer 104.

Further illustrated in FIG. 4A is a general direction of each of the supply tubes 222. As shown, each of the supply tubes 222 is generally directed toward a center region 241 of the wafer 104 in the center region direction 240. As such, in one embodiment, DI water is directed toward the center region 241 of the wafer 104. However, in a different embodiment, other fluids such as chemicals (e.g., HF) used in etching layers of films formed over wafers, and gases (e.g., $N_2$) may be delivered to the SRD module utilizing one or more of the remaining pairs of ring inlets 220e and outlets 220e'.

Figure 4B:
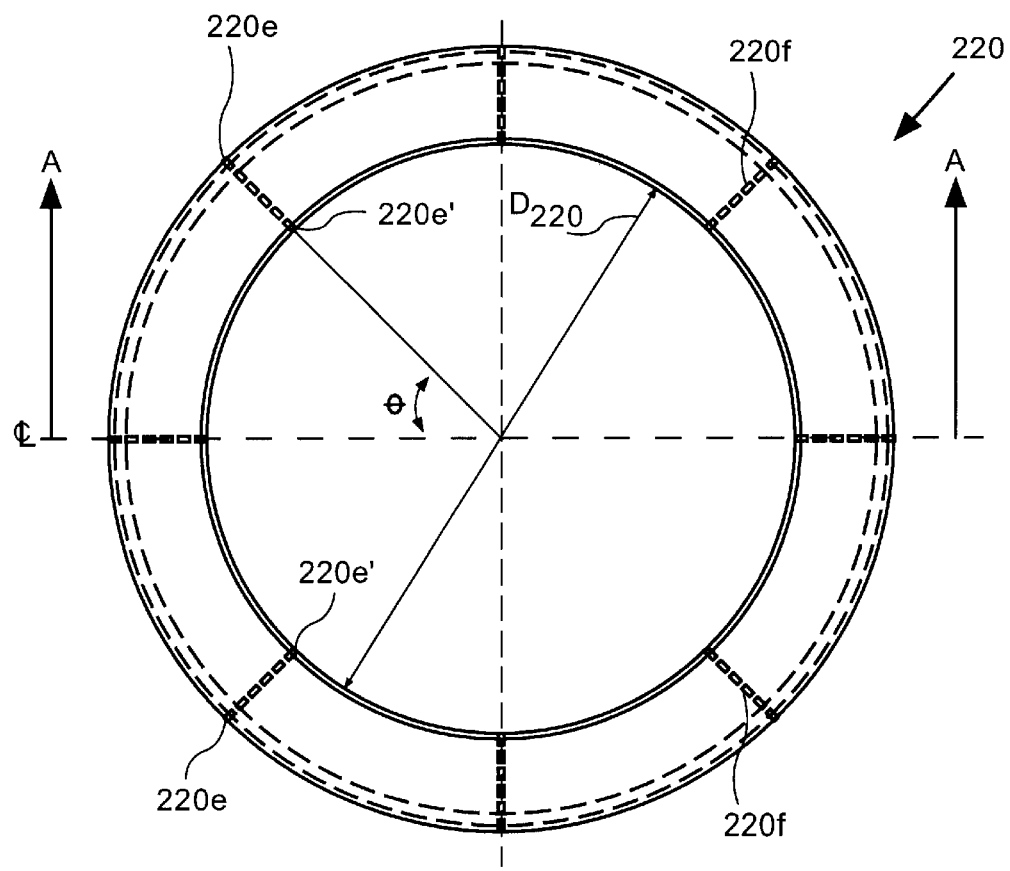
FIG. 4B is a top-view of a fluid delivery ring, in accordance with yet another aspect of the present invention.

FIG. 4B is a top-view of the fluid delivery ring 220 and depicts the positions of the ring inlets 220e, and their corresponding ring outlets 220e' and slots 220f, in accordance with one embodiment of the present invention. As illustrated, for a 300 mm wafer, in one embodiment, the inner radius $D_{220}$ of the fluid delivery ring may range from approximately about 13.5 inches to about 4 inches, and preferably is about 13.125 inches. Furthermore, the angle θ, which corresponds to the circular distance between the two adjacent ring outlets 220e' as well as the two adjacent ring inlets 220e, approximately ranges from about 30 degrees to about 180 degrees, and preferably is about 45 degrees.

Figure 4C:
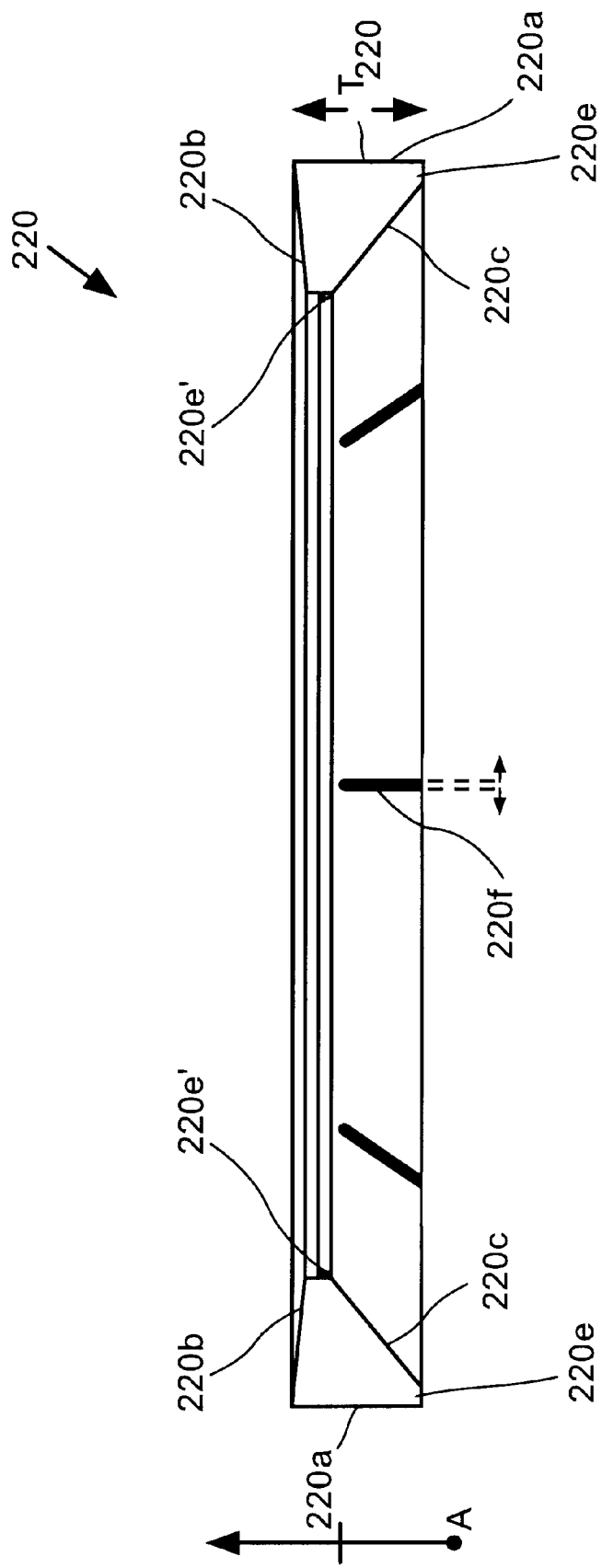
FIG. 4C is a simplified cross-sectional view of a fluid delivery ring, in accordance with another embodiment of the present invention.

An A—A cross-sectional view of the fluid delivery ring 220 of FIG. 4B is depicted in FIG. 4C, in accordance with another embodiment of the present invention. Illustrated in the embodiment of FIG. 4C are a plurality of ring inlets 220e as well as their corresponding ring outlets 220e' and slots 220f. Also shown are the downwardly sloped ring topwall 220b of the fluid delivery ring 220.

As shown, preferably, a width of each slot 220f approximately ranges from about 0.125 inch to about 0.250 inch, and preferably is about ⅛ inch. In addition, the thickness $T_{220}$ of the fluid delivery ring 220 ranges approximately from about 0.75 inches to about 2.00 inches, and preferably is approximately about 1.722 inches.

Figures 1, 4D:
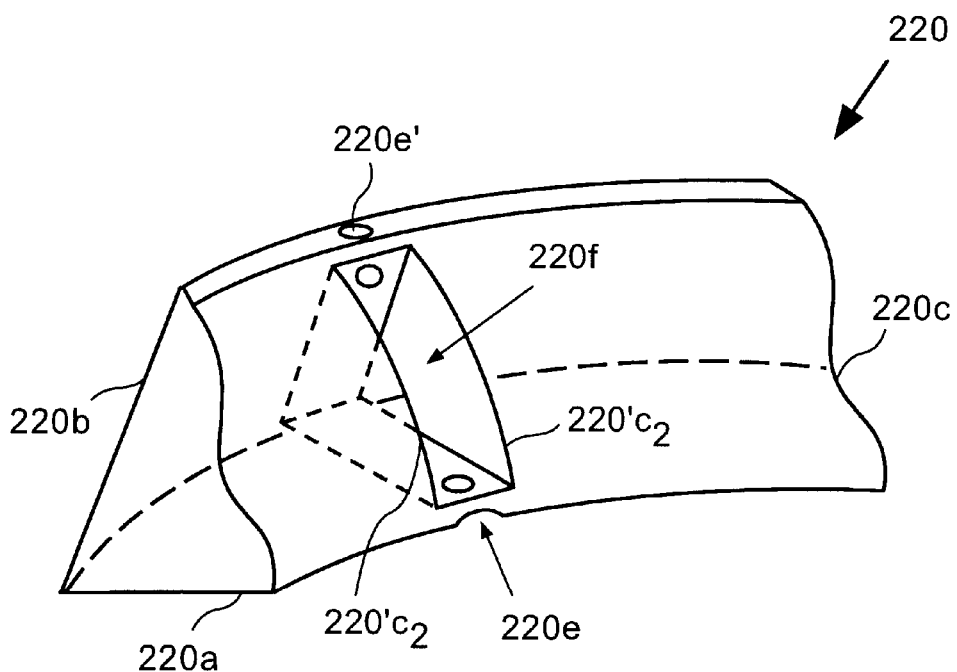

FIG. 4D-1 is a partial three-dimensional view of a fluid delivery ring 220, illustrating one of several hollow cavities, slots 220f of the fluid delivery ring 220, in accordance with another embodiment of the present invention. As illustrated, a removed volume $220f_1$ is defined within the fluid delivery ring so as to allow the supply tube 222 (not shown in this drawing) be inserted into the fluid delivery ring 220 through a ring inlet 220e and exit through a ring outlet 220e'. As shown, in one embodiment, the removed volume $220f_1$ may have a profile substantially similar to that of the fluid delivery ring 220. However, it must be appreciated to one of ordinary skill in the art that the profile of the removed volume $220f_1$ may have a different shape.

Figures 2, 4D:
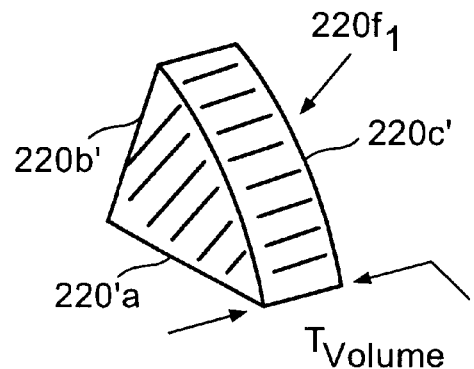

FIG. 4D-2 is a three-dimensional view of the removed volume $220f_1$ of the slot of FIG. 4D-1, in accordance with another aspect of the present invention. As shown, the removed volume $220f_1$ has a solid core and is made out of Teflon™. In a preferred embodiment, the thickness $T_{volume}$ of the removed volume approximately ranges from about 0.125 inch to about 0.250 inch, and is preferably about ⅛ inch.

Although the foregoing invention has been described in some detail for purposes of clarity of understanding, it will be apparent that certain changes and modifications may be practiced within the scope of the appended claims. For example, embodiments described herein have been primarily directed toward spinning, rinsing, and drying (SRD) wafers; however, it should be understood that the SRD module of the present invention is well suited for spin rinsing of any type of substrate. Furthermore, implementations described herein have been particularly directed toward SRD module utilizing a 300-mm wafer; however, it should be understood that the SRD module of the present invention is well suited for spin rinsing of any size wafer or substrate, such as hard disks. Accordingly, the present embodiments are to be considered as illustrative and not restrictive, and the invention is not to be limited to the details given herein, but may be modified within the scope and equivalents of the appended claims.

What is claimed is:

1. A fluid delivery module for use in preparing a substrate, the fluid delivery module comprising:
    a process bowl designed to contain a substrate to be prepared, the process bowl having a bottom wall and a sidewall;
    a fluid delivery ring configured to be attached to the sidewall of the process bowl, the fluid delivery ring including,
        a plurality of inlet and outlet pairs being defined in the fluid delivery ring, each of the plurality of inlet and outlet pairs being designed to receive a respective supply tube, each respective supply tube having an end that terminates at each of the outlets of the fluid delivery ring and configured to direct fluid onto a surface of the substrate.

2. A fluid delivery module for use in preparing a substrate as recited in claim 1, wherein the sidewall of the bowl further comprise:
    a plurality of channels equal to a number of supply tubes, such that the supply tubes feed through the each of the plurality of channels that lead to the plurality of inlet and outlet pairs in the fluid delivery ring.

3. A fluid delivery module for use in preparing a substrate as recited in claim 2, further comprising:
    a respective seal being configured to secure the supply tubes within the respective channels of the process bowl sidewall.

4. A fluid delivery module for use in preparing a substrate as recited in claim 1, wherein each end of the respective supply tubes is generally directed toward a center region defined by the fluid delivery ring, the center region defining a location of the substrate.

5. A fluid delivery module for use in preparing a substrate as recited in claim 4, wherein the fluid delivery ring further comprises:
    a plurality of slots defined at a location of each of the inlet and outlet pairs, each slot being configured to define a path for the respective supply tubes.

6. A fluid delivery module for use in preparing a substrate as recited in claim 4, wherein the fluid delivery ring, the process bowl, and the respective supply tubes are each defined from a chemically inert material.

7. A fluid delivery module for use in preparing a substrate as recited in claim 4, wherein the fluid delivery ring has a triangular cross-sectional shape.

8. A fluid delivery module for use in preparing a substrate as recited in claim 7, wherein the inlet and outlet pairs are defined at opposing corners of the triangular cross-sectional shape, and the outlets of the inlet and outlet pairs are defined around one of the corners that is most proximate to the center region.

9. A fluid delivery module for use in preparing a substrate as recited in claim 8, wherein the outlets of the fluid delivery ring are defined around a ring diameter of the fluid delivery ring that is larger than a diameter of the substrate .

10. A fluid delivery module for use in preparing a substrate as recited in claim 1, wherein the process bowl is configured to enclose a chuck for holding and rotating the substrate.

11. A fluid delivery module for use in preparing a substrate as recited in claim 10, wherein the chuck is configured to be fixed at a height and the process bowl is configured to move between a first position and a second position.

12. A fluid delivery module for use in preparing a substrate as recited in claim 1, wherein the fluid is selected from one or more of DI water, chemicals, and gases, each being configured to be supplied to a surface of the substrate to enable the preparation.

13. A fluid delivery module for use in preparing a substrate as recited in claim 1, wherein the substrate is a semiconductor wafer.

14. A fluid delivery ring for use in a substrate spin module, the fluid delivery ring configured to be attached to a sidewall of a process bowl, the fluid delivery ring comprising:
    a plurality of inlet and outlet pairs being defined in the fluid delivery ring, each of the plurality of inlet and outlet pairs being designed to receive a respective supply tube, each respective supply tube having an end that terminates at each of the outlets of the fluid delivery ring and configured to direct fluid onto a surface of the substrate.

15. The fluid delivery ring as claimed in claim 14, wherein each of the respective supply tubes is configured to deliver fluid onto a surface of the substrate in a general direction of a center region, the center region being a location of the substrate to be prepared.

16. The fluid delivery ring as claimed in claim 14, wherein the fluid delivery ring, the process bowl, and the respective supply tubes are each defined from a chemically inert material.

17. The fluid delivery ring as claimed in claim 14, wherein the outlets of the fluid delivery ring are defined around a ring diameter of the fluid delivery ring that is larger than a diameter of the substrate to be prepared.

18. A fluid delivery ring for use in a substrate rinsing module, the fluid delivery ring comprising:
    a triangular structure having a sidewall, an underside, and a generally circular shape topwall;
    a plurality of inlet and outlet pairs, the inlets being defined between the sidewall and the underside and the outlets being defined between the underside and the topwall, each inlet and outlet pair being configured to receive and secure a plurality of respective supply tubes, wherein each of the respective supply tubes is configured to terminate at each of the respective outlets and to deliver fluid on to a surface of a substrate to be prepared.

19. The fluid delivery ring as claimed in claim 18, wherein the fluid delivery ring is constructed from a chemically inert material.

20. A fluid delivery ring as claimed in claim 18, wherein the inlet and outlet pairs are respectively defined between the sidewall and the underside and the topwall and the underside, symmetrically.

21. A fluid delivery ring as claimed in claim 18, further comprising:
    a plurality of slots defined within the triangular structure, each of the respective slots being defined between each of the inlet and outlet pairs and on the underside of the triangular structure.

* * * * *